United States Patent [19]

Terakado et al.

[11] Patent Number: 5,350,918
[45] Date of Patent: Sep. 27, 1994

[54] TRANSMISSION ELECTRON MICROSCOPE

[75] Inventors: Sadao Terakado, Katsuta; Hiroyuki Kobayashi, Mito; Morioki Kubozoe, Katsuta, all of Japan

[73] Assignees: Hitachi, Ltd., Tokyo; Hitachi Science Systems, Ltd., Katsuta, both of Japan

[21] Appl. No.: 936,008

[22] Filed: Aug. 27, 1992

[30] Foreign Application Priority Data

Aug. 30, 1991 [JP] Japan ............... 3-219592

[51] Int. Cl.⁵ .............................................. H01J 37/26
[52] U.S. Cl. .............................................. 250/311
[58] Field of Search ........................... 250/311, 306

[56] References Cited

U.S. PATENT DOCUMENTS

| | | | |
|---|---|---|---|
| 2,632,115 | 3/1953 | Bruck | 250/311 |
| 3,835,246 | 9/1974 | Muller et al. | |
| 4,091,374 | 5/1978 | Muller et al. | |
| 4,206,349 | 6/1980 | Kamimura | 250/311 |
| 4,724,319 | 2/1988 | Shirota | 250/311 |
| 5,013,915 | 5/1991 | Isakozawa et al. | 250/311 |
| 5,117,112 | 5/1992 | Ito | 250/311 |

FOREIGN PATENT DOCUMENTS 2851640  6/1979  Fed. Rep. of Germany.
61-243648  3/1987  Japan.

*Primary Examiner*—Bruce C. Anderson
*Attorney, Agent, or Firm*—Antonelli, Terry, Stout & Kraus

[57] ABSTRACT

In a transmission electron microscope, an electron beam from an electron gun is irradiated on a specimen by an illuminating lens system and a transmission image of the specimen is formed on a photographic film by an image forming lens system. The transmission image is picked up by a TV camera and displayed on a television display screen and a view field range of recording image with the photographic film is manifested on the display screen.

8 Claims, 3 Drawing Sheets

FIG. 3(a) FIG. 3(b) FIG. 3(c) FIG. 3(d) FIG. 3(e)
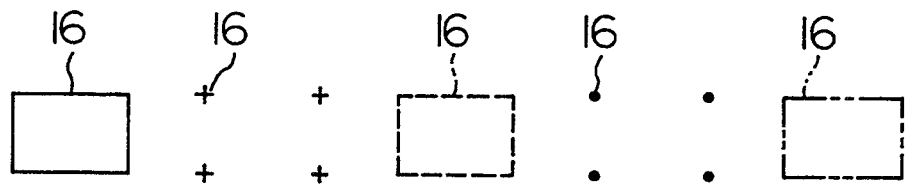
FIG. 4(a)    FIG. 4(b)    FIG. 4(c)
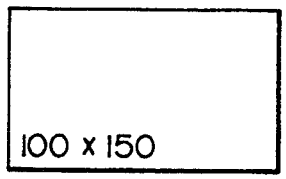 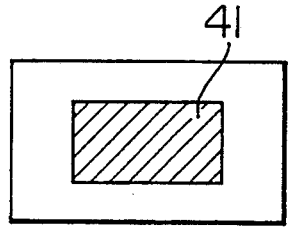 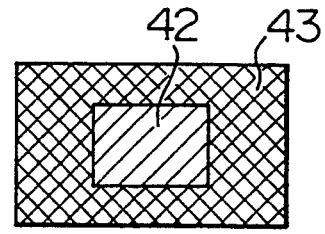

TRANSMISSION ELECTRON MICROSCOPE

BACKGROUND OF THE INVENTION

The present invention relates to a transmission electron microscope (hereinafter referred to as "electron microscope") and especially to an apparatus effective at image observation for image photographing.

Conventionally, recording of an electron microscope image has been effected with a photographic film.

Then, a fluorescent screen for image observation is placed between the photographic film and an image formation lens system in order that a transmission image can be confirmed by means of the fluorescent screen.

On the other hand, in recent years, it has been practiced widely to perform image observation by mounting a television (TV) system to an electron microscope, photographing a transmission image by means of a TV camera and displaying the image on a CRT screen (for example, JP-A-2-278644).

However, the confirmation of a view field which is recorded with the photographic film is effected at present by means of the fluorescent screen and the TV system is constructed as a system independent of the image photographing.

In an electron microscope without any fluorescent screen for image observation, only one means provided for image observation is such that an image picked up through a TV camera is observed with a CRT for image display. While in recent years the capacity of an image memory has been increasing abruptly, the memory capacity of a photographic film which has hitherto been used to record electron microscope images is extraordinarily larger in comparison with the aforementioned image memory and the photographic film is cheaper. Accordingly, the photographic film is expectedly used from now on to record electron microscope images.

Incidentally, the size of a view field pictured on a photographic film is finite and for this reason, it is always concerned about which range of a view field being observed on the CRT can be pictured on the photographic film. Unless the photographing range is definite, there is a possibility that a view field desired to be pictured cannot be photographed at will.

The magnification for image observation is not always equal to the magnification for photographing and this makes decision of the photographing range much difficult.

SUMMARY OF THE INVENTION

A main object of the present invention is to provide a transmission electron microscope which can perform image photographing easily and precisely without committing erroneous recognition of the image photographing range.

Another object of the present invention is to improve operational capability needed for manifesting the photographing range.

According to the present invention, to accomplish the aforementioned main object, an electron microscope proper and an image observing unit including a television display screen are controlled associatively so that a view field range of an image photographed with image record means such as a photographic film may be manifested on the image observing television display screen. Further, the image photographing view field range to be manifested can be varied automatically in accordance with a magnification for image photographing and a magnification for image observation.

According to the present invention, to accomplish the aforementioned second object, means is provided which gives, when the image photographing view field range exceeds the television display screen upon manifesting the image photographing view field range on the television display screen, information to this effect, and means is provided which commands or releases a manifestation per se of the image photographing view field range on the television display screen.

According to the invention, a view field range which will be pictured with the image record means is manifested on the image observing television screen. For example, a photographing view field range is superimposed on an observation image on the television screen so as to be graphically displayed in the form of a white bright line. Accordingly, the operator of the electron microscope can confirm a range to be recorded on the image record means by merely watching the image observing television screen. In addition, even when the imaging magnification and view field magnification are adjusted, the photographing view field manifesting range is automatically decreased associatively with the adjustment if the observation magnification is smaller than the photographing magnification but the photographing view field manifesting range is automatically increased associatively with the adjustment if the observation magnification is larger than the photographing magnification, thus ensuring that the magnification adjustment can be done freely while confirming the photographing view field range.

Further, when the observation magnification exceeds a limit and the size of a photographing view field goes beyond the observing television screen, a manifestation by which a view field range is manifested graphically will disappear from the screen. But, according to the second invention of the present invention, information to this effect is given to the operator to prevent erroneous photographing due to loss of the view field range, and when a manifestation of a photographing view field range hinders image observation, the manifestation can be released, thus eliminating inconvenience which would otherwise be caused by the manifestation.

BRIEF DESCRIPTION OF THE DRAWINGS

FIG. 3(a–e) are diagrams showing various kinds of modified examples of photographing view field range manifesting figure.

FIG. 4(a–c) are diagrams showing further embodiments of the photographing view field range manifestation.

DESCRIPTION OF THE PREFERRED EMBODIMENTS

Figure 1:
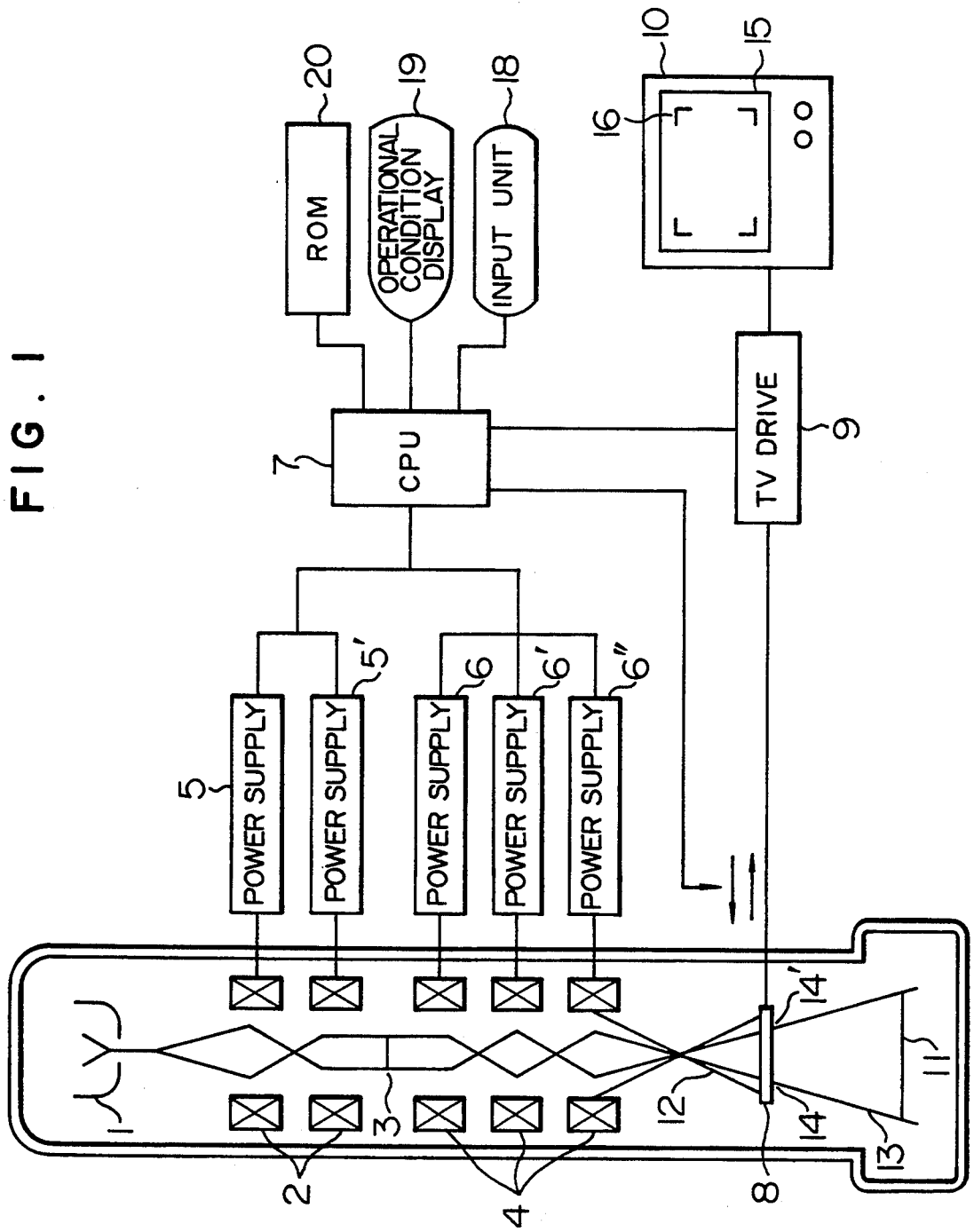
FIG. 1 is a block diagram showing a transmission electron microscope according to an embodiment of the present invention.

FIG. 1 is a block diagram showing an embodiment of the present invention.

Designated by 1 is an electron gun section from which an electron beam for irradiating a specimen is emitted. Designated by 2 is an illuminating lens system which is used to set illuminating conditions for irradiation of specimen 3 with the electron beam. Designated by 4 is an image forming lens system which includes an objective lens that is closest to the specimen 3. Designated 5 and 5' are exciting power supplies for respective lenses of the illuminating lens system and designated by 6 to 6" are exciting power supplies for respective lenses of the image forming lens system. These power supplies are controlled by a CPU 7. Designated by 8 is a TV camera section which is comprised of, for example, a light receiver for converting the electron beam into light and CCD elements. Designated by 9 is a TV drive and by 10 is a TV display. Designated by 15 is a display screen adapted to display a range as indicated by 12 within which the TV camera section is irradiated with the electron beam. Although only one-dimensional illustration of range 12 is given, the range also extends likewise in a direction orthogonal to the sheet of drawing to produce a two-dimensional display as indicated at 15. Designated by 11 is image photographing record means, for example, a photographic film on which a range as indicated at 13 is recorded. Assuming that the range 13 intersects the TV camera section 8 of the light receiver at 14, 14', there occurs a range on display screen 15 which corresponds to a range recorded on a photograph. Conveniently, the range to be recorded on a photograph is manifested on the display screen 15 and in the present embodiment displayed as shown at 16.

The TV camera section 8 is interposed between the photographic film 11 and image forming lens system 4 and therefore, when taking a picture for image record, the TV camera section can be moved from the observing position in arrow directions so as not to hinder the photographing view field.

Figure 2:
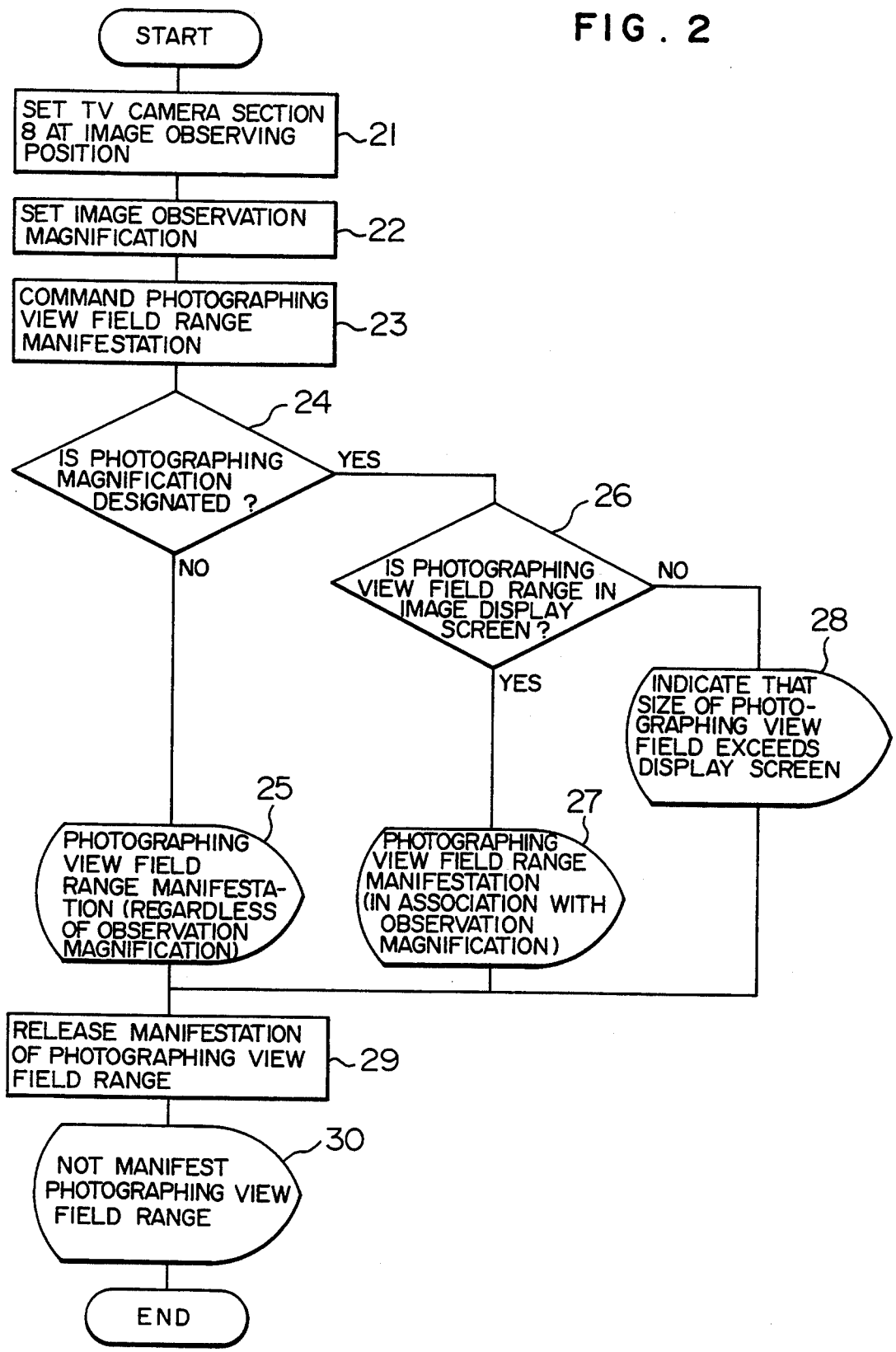
FIG. 2 is a diagram showing an embodiment of a flow chart for photographing view field range manifestation.

FIG. 2 is a process flow chart of the CPU 7, showing an embodiment of a flow chart of the photographing view field range manifestation featuring the present invention. The operation of FIG. 1 will now be described with reference to the flow chart of FIG. 2.

The TV camera section 8 is set at an image observing position by means of an input unit 18 (step 21). When an image observation magnification is commanded by the input unit 18, lens condition data corresponding to the magnification and which is stored in advance in a ROM 20 is transferred to the CPU 7, so that the image forming lens exciting power supplies 6 to 6" are controlled by the CPU 7 and an image is displayed at the commanded magnification on the display screen 15 (step 22). The magnification at that time is displayed on an operational condition display 19. When a photographing view field range manifestation is commanded by the input unit 18 (step 23), it is decided by the CPU 7 whether a photographing magnification is commanded or not (step 24) and if "No" is issued indicating that a picture is to be photographed at the magnification for observation, a photographing view field range is determined by 14, 14' to have a size which is determined definitely depending on the positional relation of the image forming lens system 4 with respect to the TV camera section 8 and photographic film 11 and the relation between the size of the TV camera 8 of light receiver and the size of photographing view field of the photographic film 11, with the result that a photographing view field range manifesting FIG. 16 is manifested on the display screen 15 as a fixed figure regardless of the observation magnification (step 25). Even when an image is observed at various magnifications as necessary, the image is finally observed at a photographing magnification and therefore it is also possible to set the photographing view field range as a fixed manifesting figure. However, when a photographing magnification is determined in advance and an image is observed at a magnification other than the predetermined one, a manifestation of size of the photographing view field is convenient to the user. For example, when an entire view field desired to be photographed is too wide to be confined within one sheet of photographic film at a predetermined photographing magnification, the observing magnification is decreased to below the commanded photographing magnification to display the entire view field desired to be photographed on the display screen 15 together with a manifestation of a photographing view field range at the photographing magnification commanded in advance, thus ensuring that an approximate number of photographing operations which can cover the entire view field desired to be photographed can be estimated for extreme convenience. The image forming lens system 4 and TV drive 9 are controlled by the CPU 7 and therefore, when "Yes" is issued from step 24 of FIG. 2, the photographing view field range manifesting FIG. 16 is changed in size in accordance with an observation magnification for a commanded photographing magnification through a line of "Yes" of step 26 and step 27. When the observation magnification is so higher than the commanded photographing magnification that the difference exceeds a limit, the photographing view field range goes beyond the display screen 15 and in some cases, the photographing view field range manifesting FIG. 16 disappears from the display screen (step 26, "No"). Under such a condition, an indication for informing the operator of electron microscope that the size of the photographing view field exceeds the display screen 15 may also be displayed on the display screen (step 28). Especially, when the photographing view field range is displayed in the form of a figure, this figure will disappear; and therefore the above indication is effective to prevent erroneous photographing and arouse the operator's attention.

When observing an image on the display screen 15, the manifestation of the photographing view field range will conceivably be obstructive in some cases. In such a case, the operator may selectively operate the input unit 18 to release the manifestation of the photographing view field range (steps 29 and 30).

Since in general the size of most of the light receiver of TV camera section 8 is smaller than that of photographing film 11, the light receiver is ordinarily disposed close to the image forming lens system 4 as shown in FIG. 1; but due to the fact that apparent resolution is more degraded at this position than at the position of the photographic film 11, the TV camera section may sometimes be arranged below the photographic film in the case of a high resolution TV. In this case, the photographing view field manifesting figure will not appear on the display screen unless the observation magnification is sufficiently decreased to below the photographing magnification but even in such a case, it is conveniently permitted to know which portion of the observation view field can be confined within one sheet of picture.

FIG. 3 shows modified examples of photographing view field range manifesting FIG. 16 in which the photographing view field range is displayed in the form of a quadrangle of solid line in FIG. 3(a), four corners of the photographing view field range are displayed in a crucial form in FIG. 3(b) and the range is likewise displayed in the form of dashed lines or the like in FIG. 3(c) to FIG. 3(e). Any of these figures may be fixed in advance for individual electron microscopes or may be selected desirably by the operator in accordance with an observation image.

FIG. 4 shows further modified examples of the photographing view field range manifesting method. Shown in FIG. 4(a) is the case where the size of the photographing view field range as viewed from above the display screen is displayed numerically to the effect that height (cm)×width (cm) is "100×150", shown in FIG. 4(b) is the case where only an observation image 41 of the photographing view field range is displayed and shown in FIG. 4(c) is the case where brightness of the display screen is changed for an observation image 42 within the photographing view field range and an image 43 outside the range. The operator can also command selectively any of the manifesting methods through the input unit 18.

According to the present invention, the photographing view field range can be confirmed while observing an image on the image observing television display screen and therefore a photographing image can be obtained easily and precisely without committing erroneous recognition of the photographing range.

Even when observation image and the like are changed as a result of adjustment of magnification, the photographing range can be confirmed easily and a proper photographing image can be obtained.

In addition, operational errors concomitant with the photographing view field range manifestation and faults during image observation can be avoided to improve operational capability.

We claim:

1. A transmission electron microscope comprising an electron gun, an illuminating lens system for irradiating an electron beam from said electron gun onto a specimen, an image formation lens system for forming an enlarged transmission image of said specimen on a record surface of image photographing record means, an image observing display apparatus having a display screen for displaying the enlarged transmission image of said specimen, a photographing view field range detecting apparatus for determining a specimen image range to be recorded by said image photographing record means, and a manifesting apparatus for showing on said display screen said specimen image range to be recorded.

2. A transmission electron microscope according to claim 1, wherein said manifesting apparatus shows said specimen image range in the form of a figure which is superimposed on an observation image.

3. A transmission electron microscope according to claim 1, wherein said manifesting apparatus shows the size of said specimen image range in terms of a numeral.

4. A transmission electron microscope according to claim 1, wherein said manifesting apparatus shows said specimen image range by displaying only an observation image inside said specimen image range on said screen.

5. A transmission electron microscope according to claim 1, wherein said manifesting apparatus shows said specimen range by displaying an observation image inside said specimen image range and that outside said range at discriminative brightness levels.

6. A transmission electron microscope comprising an electron gun, an illuminating lens system for irradiating an electron beam from said electron gun onto a specimen, an image formation lens system for forming an enlarged transmission image of said specimen on a record surface of image photographing record means, an image observing display means having a display screen for displaying the enlarged transmission image of said specimen, a magnification setting apparatus for inputting a magnification for image photographing and a magnification for an observation image on said display screen, a photographing view field range detecting apparatus for determining a specimen image range to be recorded by said image photographing record means in accordance with said magnification for image photographing and said magnification for the observation image, and a manifesting apparatus for showing on said display screen said specimen image range to be recorded.

7. A transmission electron microscope comprising an electron gun, an illuminating lens system for irradiating an electron beam from said electron gun onto a specimen, an image formation lens system for forming an enlarged transmission image of said specimen on a record surface of image photographing record means, an image observing display apparatus having a display screen for displaying the enlarged transmission image of said specimen, a magnification setting apparatus for inputting magnifications for an observation image on said display screen and for image photographing, a photographing view field range detecting apparatus for determining a specimen image range to be recorded by said image photographing record means, a manifesting apparatus for showing on said display screen said specimen image range to be recorded, and means for providing, when said specimen image range to be recorded exceeds said image display range on the display screen depending on the relation between said magnification for image photographing and said magnification for an observation image, a display on said display screen of a signal indicating the exceeding state.

8. A transmission electron microscope comprising an electron gun, an illuminating lens system for irradiating an electron beam from said electron gun onto a specimen, an image formation lens system for forming an enlarged transmission image of said specimen on a record surface of image photographing record means, an image observing display means having a display screen for displaying the enlarged transmission image of said specimen, means for determining a specimen image range to be recorded by said image photographing record means in an image display range on the display screen of said image observing display means, and means for displaying said specimen image range to be recorded on said display screen of said image observing display means in accordance with an input instruction.

* * * * *